US006749993B2

(12) United States Patent
Hiraoka

(10) Patent No.: US 6,749,993 B2
(45) Date of Patent: Jun. 15, 2004

(54) PLANOGRAPHIC PRINTING PRECURSOR AND PRINTING METHOD EMPLOYING THE SAME

(75) Inventor: Saburou Hiraoka, Tokyo (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 10/337,303

(22) Filed: Jan. 6, 2003

(65) Prior Publication Data

US 2003/0152868 A1 Aug. 14, 2003

(30) Foreign Application Priority Data

Feb. 6, 2002 (JP) ....................................... 2002-029200

(51) Int. Cl.[7] ............................. G03F 7/11; G03F 7/16; G03F 7/38; B41N 1/00; B41M 1/06

(52) U.S. Cl. ................................ 430/273.1; 430/217.1; 430/272.1; 430/302; 430/501; 430/961; 430/964

(58) Field of Search ........................... 430/271.1, 272.1, 430/273.1, 501, 961, 964

(56) References Cited

U.S. PATENT DOCUMENTS 3,476,937 A * 11/1969 Vrancken
4,004,924 A * 1/1977 Vrancken et al.
5,948,591 A * 9/1999 Vermeersch et al.
6,190,828 B1 * 2/2001 Verschueren et al.
6,383,692 B1 * 5/2002 Leenders et al.
6,391,516 B1 * 5/2002 Vermeersch et al.

FOREIGN PATENT DOCUMENTS

EP 599510 * 11/1994
EP 770495 * 5/1997

* cited by examiner

*Primary Examiner*—Richard L. Schilling
(74) *Attorney, Agent, or Firm*—Muserlian, Lucas and Mercanti

(57) ABSTRACT

Disclosed is a planographic printing plate precursor comprising a support, and provided thereon, an image forming layer, a first outermost layer on the image forming layer side and a second outermost layer on the side of the support opposite the first outermost layer, the first and second outermost layers containing a lubricant component, which is manufactured either by a method comprising the steps of preparing a planographic printing plate precursor comprising a support and provided thereon, an image forming layer so that only the first outermost layer contains a lubricant component and winding the resulting precursor in the roll form, or by a method comprising the steps of preparing a planographic printing plate precursor comprising a support and provided thereon, an image forming layer so that only the second outermost layer contains a lubricant component and winding the resulting precursor in the roll form.

10 Claims, 1 Drawing Sheet

PLANOGRAPHIC PRINTING PRECURSOR AND PRINTING METHOD EMPLOYING THE SAME

FIELD OF THE INVENTION

The present invention relates to a planographic printing plate precursor (hereinafter referred to also as a printing precursor) and a printing method employing the precursor.

BACKGROUND OF THE INVENTION

Recently, as computers or digital technique spread, a computer to plate (CTP) process, in which a printing plate is prepared by directly writing an image onto a planographic printing plate precursor based on an electronic image data, is spreading in a planographic printing plate making process. This process does not require a film-making process, resulting in cost decrease and in simplification of the process.

Synchronized with the spread of CTP processes, office automation in the printing field prevails, and economy of space has been increasingly desired at working environment. A printing press such as True Press produced by Dainippon Screen manufacturing Co., Ltd. or Quick Master 46DI produced by Heiderberg PMT Co., Ltd., comprising an exposure device in it, is compact and does not require an off-line plate setter, which contributes to economy of space.

A planographic printing plate precursor used in these printing presses is in the form of roll and employs a plastic film as a support. The planographic printing plate precursor is transported through a transporting member such as a guide roller, and supplied to a plate cylinder in the printing press, but in many cases the transporting member has had an adverse effect on the printing plate precursor. Typically, the surface of the printing plate precursor is scratched with the transporting member-to produce scratches due to transport, and the scratches have often caused image defects on the printed matter.

Quick master 46DI is a system employing a printing plate material Pearl Dry Plate produced by Prestec Co., Ltd. The Pearl Dry Plate has a structure in that an oleophilic layer, a light-heat converting layer, and a silicone rubber layer are provided in that order on a support, and has problem in that scratches produced on the silicone rubber layer results in contamination on the background (non-image portions).

Further, jamming is likely to occur during transport of the printing plate material. The jamming stops printing, requires the printing plate material to be reset, and further results in great loss of printed matter. In order to reduce jamming due to transport, a method is considered which provides a back coat layer reducing a friction on the rear side of the support opposite the image forming layer. However, this method increases a process for manufacturing a planographic printing plate precursor, resulting in an increase in cost.

Provision of a lubricant-containing layer on the side of the support opposite the image forming layer has problem in that contamination is likely to occur during manufacture.

SUMMARY OF THE INVENTION

An object of the present invention is to provide a planographic printing plate precursor which does not produces scratches due to transport nor transport faults, and reduces image defects and cost. Another object of the present invention is to provide a printing method employing the planographic printing plate precursor.

DETAILED DESCRIPTION OF THE INVENTION

Figure 1:
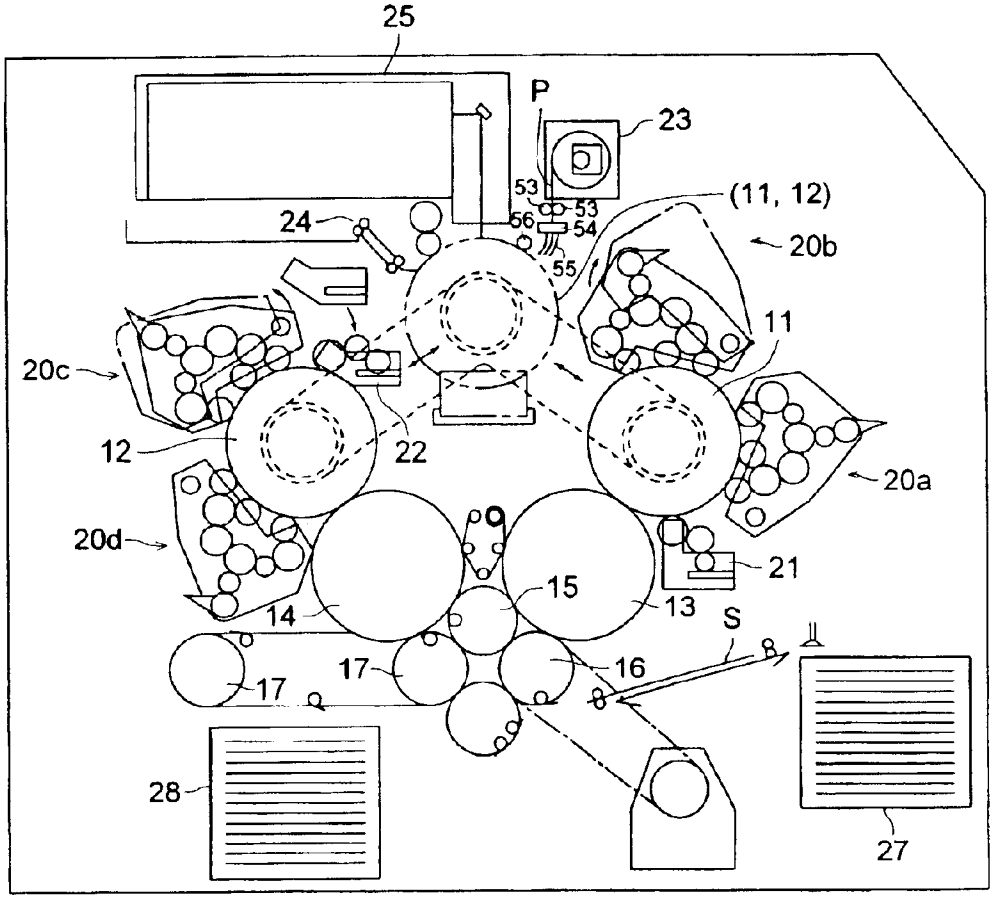
FIG. 1 shows a sectional view of one embodiment of a printing press used in the invention.

The above object of the invention has been attained by any one of the following constitutions:

1. A planographic printing plate precursor comprising a support and provided thereon, an image forming layer, a first outermost layer on the image forming layer side and a second outermost layer on the side of the support opposite the first outermost layer, the first and second outermost layer containing a lubricant component, wherein the planographic printing plate precursor is manufactured either by a method comprising the steps of preparing a planographic printing plate precursor comprising a support and provided thereon, an image forming layer so that only a first outermost layer on the image forming layer side contains a lubricant component and winding the resulting printing plate precursor around a spool in the roll form to transfer a part of the lubricant component of the first outermost layer to the second outermost layer, or by a method comprising the steps of preparing a planographic printing plate precursor comprising a support and provided thereon, an image forming layer so that only a second outermost layer on the side of the support opposite the first outermost layer contains a lubricant component and winding the resulting printing plate precursor around a spool in the roll form to transfer a part of the lubricant component of the second outermost layer to the first outermost layer.

2. The planographic printing plate precursor of item 1 above, wherein a hydrophilic layer is provided between the image forming layer and the support.

3. The planographic printing plate precursor of item 1 above, wherein the first outermost layer is the image forming layer, and the lubricant component is heat-fusible particles with an oleophilic property.

4. The planographic printing plate precursor of item 1 above, wherein the support comprises a plastic.

5. The planographic printing plate precursor of item 1 above, wherein the lubricant component is in the form of particles, and the particle diameter of the particles is 0.1 to 2.0 $\mu$m.

6. The planographic printing plate precursor of item 1 above, wherein the first outermost layer and the second outermost layer contain the lubricant component in an amount of from 0.05 to 2.00 g/m$^2$.

7. A planographic printing plate precursor comprising a support and provided thereon, an image forming layer, a first outermost layer on the image forming layer side and a second outermost layer provided on the side of the support opposite the first outermost layer, the first and second outermost layer containing a lubricant component and having a coefficient of static friction of from 0.05 to 2.00, wherein the planographic printing plate precursor is manufactured by a method comprising the steps of preparing a planographic printing plate precursor comprising a support and provided thereon, an image forming layer so that only a first outermost layer on the image forming layer side contains a lubricant component and has a coefficient of static friction of from 0.05 to 2.00, and winding the resulting printing plate precursor around a spool in the roll form to transfer a part of the lubricant component of the first outermost layer to the second outermost layer, so that a second outermost layer provided on the side of the support opposite the first outermost layer has a coefficient of static friction of from 0.05 to 2.00.

8. The planographic printing plate precursor of item 7 above, wherein the second outermost layer provided on the side of the support opposite the first outermost layer, before the winding step, has a coefficient of static friction of from 2.00 to 5.0.

9. A method of printing employing a planographic printing plate precursor, comprising a support and provided thereon, an image forming layer, a first outermost layer on the image forming layer side and a second outermost layer on the side of the support opposite the first outermost layer, the first and second outermost layers containing a lubricant component, wherein the planographic printing plate precursor is manufactured either by a method comprising the steps of preparing a planographic printing plate precursor comprising a support and provided thereon, an image forming layer so that only a first outermost layer on the image forming layer side contains a lubricant component and winding the resulting printing plate precursor around a spool in the roll form to transfer a part of the lubricant component of the first outermost layer to the second outermost layer, or by a method comprising the steps of preparing a planographic printing plate precursor comprising a support and provided thereon, an image forming layer so that only a second outermost layer on the side of the support opposite the first outermost layer contains a lubricant component and winding the resulting printing plate precursor around a spool in the roll form to transfer a part of the lubricant component of the second outermost layer to the first outermost layer, the method comprising the steps of imagewise exposing the planographic printing plate precursor to laser light to form an image on the planographic printing plate precursor, and supplying ink to the exposed planographic printing plate precursor.

10. The method of printing of item 9 above, wherein the method further comprises a step of supplying dampening water to the planographic printing plate precursor between the imagewise exposing step and the ink supplying step.

101. A planographic printing plate precursor comprising a support and provided thereon, an image forming layer, wherein the planographic printing plate precursor is manufactured by a method comprising the steps of preparing a planographic printing plate precursor comprising a support and provided thereon, an image forming layer so that a first outermost layer on the image forming layer side contains a lubricant component and winding the resulting printing plate precursor around a spool to form a roll.

102. The planographic printing plate precursor of item 101 above, wherein a hydrophilic layer is provided between the image forming layer and the support.

103. The planographic printing plate precursor of item 101 or 102 above, wherein the lubricant component contains heat-fusible particles with an oleophilic property.

104. The planographic printing plate precursor of any one of items 101 through 103, wherein the support comprises a plastic.

105. The planographic printing plate precursor of any one of items 101 through 104 above, further comprising a second outermost layer on the side of the support opposite the first outermost layer, wherein the first outermost layer has a coefficient of static friction of from 0.05 to 2.00 before the precursor is wound around a spool, and the second outermost layer has a coefficient of static friction of from 0.05 to 2.00 after the precursor is wound around a spool.

106. The planographic printing plate precursor of item 105 above, wherein before the precursor is wound around a spool, the first outermost layer has a coefficient of static friction of from 0.05 to 2.0, and the second outermost layer has a coefficient of static friction of from 2.0 to 5.0, and after the precursor is wound around a spool, the first and second outermost layers have a coefficient of static friction of from 0.05 to 2.0.

107. A method of printing employing the planographic printing plate precursor of any one of items 101 through 106, wherein the method comprises the steps of imagewise exposing the planographic printing plate precursor to laser light to form an image on the planographic printing plate precursor, and supplying ink to the resulting precursor.

108. The method of printing of item 107 above, wherein the method further comprises a step of supplying dampening water to the precursor between the imagewise exposing step and the ink supplying step.

Next, the present invention will be explained in detail.

The present invention has been made in view of the above. The present inventor has made an extensive study, and has found that a planographic printing plate precursor (hereinafter referred to also as a precursor) makes it difficult to produce jamming and provides printed matter in which an adverse effect due to transport scratches is markedly reduced, the precursor comprising a support and provided thereon, an image forming layer, a first outermost layer on the image forming layer side and a second outermost layer on the side of the support opposite the first outermost layer each containing a lubricant component, wherein the precursor is manufactured either by a method comprising the steps of preparing a planographic printing plate precursor comprising a support and provided thereon, an image forming layer so that only a first outermost layer on the image forming layer side contains a lubricant component and winding the resulting printing plate precursor around a spool to form a roll, or by a method comprising the steps of comprising the steps of preparing a planographic printing plate precursor comprising a support and provided thereon, an image forming layer so that only a second outermost layer on the side of the support-opposite the first outermost layer contains a lubricant component and winding the resulting printing plate precursor around a spool to form a roll. That is, the present inventor has found that a planographic printing plate precursor having on either one side thereof an outermost layer containing a lubricant, when wound around a spool to form a roll, thereby transferring the lubricant component to the other outermost layer side to reduce friction on both sides of the precursor, improves transportability and makes it difficult to produce faults such as transport scratches.

<<Lubricant Component>>

The lubricant component will be explained below.

As the lubricant component, waxes or known silicone-modified resins can be used. Examples of the waxes used include natural waxes such as carnauba wax, bees wax, spermaceti wax, Japan wax, jojoba oil, lanolin, ozocerite, paraffin wax, montan wax, candelilla wax, ceresine wax, microcrystalline wax and rice wax; polyethylene wax; Fischer-Tropsh wax; montan wax derivatives; paraffin wax derivatives; microcrystalline wax derivatives; and higher fatty-acids.

As the silicone-modified resins, there are thermoplastic resins or synthetic rubbers which are modified with a polysiloxane chain. Examples of the resins to be modified include acryl resins, styrene-acryl resins, polyesters, polyurethanes, polyethers, polyethylene, polypropylene, polystyrene, ionomer resins, vinyl acetate resins, and vinyl chloride resins. Examples of the synthetic rubbers to be modified include polybutadiene, polyisoprene, polychloroprene, styrene-butadiene copolymer, an acrylate-butadiene copolymer, a methacrylate-butadiene copolymer, isobutylene-isoprene copolymer, acrylonitrile-butadiene copolymer, acrylonitrile-isoprene copolymer, and styrene-isoprene copolymer.

The lubricant component is preferably in the form of particles, wherein the particles are likely to be released from one uppermost layer of the precursor to transfer to the other uppermost layer of the precursor, one uppermost layer contacting the other uppermost layer in the precursor in the form of roll. It has been confirmed that the lubricant component in the form of particles (hereinafter referred to also as lubricant component particles) markedly reduces friction of the surface of the precursor to which the lubricant component transfers, which reduces transport jamming and transport scratches, and improves printing properties such as sensitivity and durability of printed images). It is preferred that the lubricant component particles are exposed on the surface of the precursor. The particle diameter of the lubricant component particles is preferably 0.1 to 2.0 μm, and more preferably 0.2 to 1.0 μm.

The lubricant component particles are preferably those in which the materials described above are emulsified, in that the shape of the particles can be maintained while the emulsion is coated on a support and dried to form a layer. Such an emulsion can be prepared according to conventional preparation methods, for example, a method disclosed in "Bunsangijutsu Sogoshiryoshu" published by Keiei Kaihatsu Center Shuppanbu.

In order to obtain the effects of the invention (reduction of transport jamming or transport scratches), the precursor of the invention comprises the outermost layer having a lubricant component content of preferably from 0.05 to 2.00 $g/m^2$.

The content of the lubricant component particles in the outermost layer is preferably from 10 to 100% by weight based on the total weight of the outermost layer.

It is preferred that the coefficient of static friction of the outermost layer containing a lubricant component in the planographic printing plate precursor is from 0.05 to 2.00, and when the planographic printing plate precursor has been wound around a spool to form a roll, the coefficient of static friction of the other outermost layer is lower than before wound, so that both outermost layers have a coefficient of static friction of from 0.05 to 2.00.

The coefficient of static friction falling within the range described above can reduce transport jamming and prevent printed matter quality from deteriorating due to transport scratches.

The coefficient of static friction in the invention was measured at 25° C. and 65% RH according to a measuring method of coefficient of friction defined in JIS K 7125.

<<Image Forming Layer>>

The image forming layer in the invention will be explained below.

The image forming layer in the invention preferably contains heat-fusible particles with oleophilic property as a main component. Materials for constituting the heat-fusible particles are preferably thermoplastic resins, synthetic rubbers or waxes described below.

Examples of the thermoplastic resins include acryl resins, styrene-acryl resins, polyesters, polyurethanes, polyethers, polyethylene, polypropylene, polystyrene, ionomer resins, vinyl acetate resins, and vinyl chloride resins.

Examples of the synthetic rubbers include polybutadiene, polyisoprene, polychloroprene, styrene-butadiene copolymer, an acrylate-butadiene copolymer, a methacrylate-butadiene copolymer, isobutylene-isoprene copolymer, acrylonitrile-butadiene copolymer, acrylonitrile-isoprene copolymer, and styrene-isoprene copolymer.

Examples of the waxes used include natural waxes such as carnauba wax, bees wax, spermaceti wax, Japan wax, jojoba oil, lanolin, ozocerite, paraffin wax, montan wax, candelilla wax, ceresine wax, microcrystalline wax and rice wax; polyethylene wax; Fischer-Tropsh wax; montan wax derivatives; paraffin wax derivatives; microcrystalline wax derivatives; and higher fatty acids.

In the invention, the melting point of the materials constituting the heat-fusible particles is preferably from 50 to 150° C. The melt viscosity of the heat-fusible particles is preferably not more than 0.02 Pa·s. The penetration defined in JIS K2530-1966 of the heat-fusible particles is preferably not more than 1.

Further, the average particle diameter of the heat-fusible particles is preferably 0.1 to 0.5 μm. The physical properties described above are important to provide high printing durability.

Among the materials described above, carnauba wax, candelilla wax, and FT wax are preferable as materials satisfying the physical properties described above.

In the invention, the image forming layer may be an outermost layer containing the lubricant component, and the heat-fusible particles with oleophilic property contained in the image forming layer may be used as the lubricant component.

The content of the heat-fusible particles with oleophilic property in the image forming layer is preferably from 40 to 100% by weight.

(Water Soluble Resin)

The water soluble resin will be explained below.

The image forming layer in the invention may contain the lubricant component, the heat-fusible particles or a water soluble resin as an agent for preventing adhesion between the heat-fusible particles during storage. Examples of the water soluble resin include conventional water soluble polymers, for example, a synthetic homopolymer or copolymer such as polyvinyl alcohol, poly(meth)acrylic acid, poly(meth)acrylamide, polyhydroxyethyl(meth)acrylate or polyvinyl methyl ether, and a natural binder such as gelatin, polysaccharides, for example, dextrane, pullulan, cellulose, gum arabic, alginic acid, polyethylene glycol, or polyethylene oxide. The water soluble polymers in the invention are preferably oligosaccharides in providing a good printing durability while preventing the heat-fusible particles from adhering to another at non-exposed portions. Oligosaccharides are saccharides in which several monosaccharides condensate by dehydration to combine with another through a glycoside bond. In the invention, the preferable oligosaccharide is trehalose, maltose, lactose or sucrose. The water soluble polymer content of the image forming layer in the invention is preferably 5 to 70% by weight.

<<Support>>

The support in the invention will be explained below.

As the support in the invention, a support comprising a plastic is preferably used. Examples of the plastic include polyethylene terephthalate, polyethylene naphthalate, a polyimide, polyamide, polycarbonate, polysulfone, polyphenylene oxide, and cellulose ester, and among these, polyethylene terephthalate and polyethylene naphthalate are especially preferred. As the support in the invention, a plastic film is preferably used. Examples of the plastic film in the invention include a polyethylene terephthalate film, a polyethylene naphthalate film, a polyimide film, a polyamide film, a polycarbonate film, a polysulfone film, a polyphenylene oxide film, and a cellulose ester film is preferred, in preventing a printing plate on the press from deviating due to an external force applied during printing, for example, ink tack. Among these, a polyethylene terephthalate film and a polyethylene naphthalate film are especially preferred.

The support may be subjected to corona discharge treatment or plasma discharge treatment in order to increase adhesion between the support and a subbing layer described later. Further, a hydrophilic layer is preferably provided on the support in order to increase adhesion between the image forming layer described above and the support.

<<Subbing Layer>>

A subbing layer will be explained below.

In order to increase adhesion between the support and a coating layer provided thereon, a subbing layer is preferably provided between the support and the coating layer. The subbing layer is preferably a layer containing gelatin or latex.

<<Hydrophilic Layer>>

A hydrophilic layer in the invention will be explained below.

The hydrophilic layer in the invention is a layer containing a hydrophilic binder and/or film-forming hydrophilic particles such as colloidal silica particles, the layer being optionally cross-linked. Examples of the film-forming hydrophilic particles include alumina sol or colloidal silica particles. Colloidal silica particles with a particle size of not more than 100 nm are preferred in that strength or hydrophilicity of the hydrophilic layer is increased. Typically, “Snowtex” series, produced by Nissan Kagaku Kogyo Co., Ltd., can be used.

In order to provide a proper layer strength or water retention property of the hydrophilic layer, necklace-shaped colloidal silica particles can be used. The necklace-shaped colloidal silica particles used in the invention refer to a general term of an aqueous dispersion containing spherical silica particles with a primary order particle diameter in “nm” order. Examples of the necklace-shaped colloidal silica particles include Snowtex PS series produced by Nissan Kagaku Kogyo Co., Ltd. The alkaline products of the series include Snowtex PS-S (an average particle diameter of 110 nm in a combined form), Snowtex PS-M (an average particle diameter of 120 nm in a combined form), and Snowtex PS-L (an average particle diameter of 170 nm in a combined form). The corresponding acidic products are Snowtex PS-S-O, Snowtex PS-M-O, and Snowtex PS-L-O, respectively.

In the invention, the content of the film-forming hydrophilic particles in the hydrophilic layer is preferably from 70 to 100% by weight. Examples of the hydrophilic binder contained in the hydrophilic layer include a homopolymer of vinyl alcohol, acrylamide, methylol-acrylamide, methylolmethacrylamide, acrylic acid, methacrylic acid, hydroxyethyl acrylate or hydroxyethyl methacrylate; a copolymer comprising one or more of the above-described monomers; and maleic acid-vinyl methyl ether copolymer. In the invention, the content of the hydrophilic binder in the hydrophilic layer is preferably from 0 to 30% by weight.

Examples of a cross-linking agent for, cross-linking the hydrophilic binder include formaldehyde, glyoxal, polyisocyanate, and hydrolyzed tetraalkylorthosilicate. In the invention, the content of the cross-linking agent in the hydrophilic layer is preferably not more than 1% by weight.

A manufacturing method of the planographic printing plate precursor of the invention will be explained below.

The planographic printing plate precursor of the invention is manufactured, for example, by coating a hydrophilic layer on the flexible support described above, and then coating an image forming layer on the resulting hydrophilic layer, employing the conventional coating methods. Examples of the coating methods include an extrusion coating method, a curtain coating method, a wire bar coating method, a gravure coating method, and a slide coating method.

In the invention, after an outermost layer containing a lubricant component (an image forming layer when the image forming layer contains a lubricant component) is coated on a support to obtain a planographic printing plate precursor, the planographic printing plate precursor is wound around a spool to form a roll. The rolled planographic printing plate precursor can reduce transport jamming and increase yield of printed matter without a back coat layer.

A light-heat converting agent used in the invention will be-explained below.

The image forming layer or hydrophilic layer in the invention can contain a light-heat converting agent which absorbs laser rays and generates heat.

The light-heat converting agent is preferably a compound which absorbs laser rays and efficiently converts to heat. Although the light-heat converting agent differs due to a light source used, for example, when a semi-conductor laser emitting near-infrared light is used as the light source, a near-infrared absorbent having absorption in the near-infrared wavelength region is preferably used. Examples of the near-infrared absorbent include an inorganic compound such as carbon black; an organic compound such as a cyanine dye, a polymethine dye, an azulenium dye, a squalenium dye, a thiopyrylium dye, a naphthoquinone dye or an anthraquinone dye; an organic metal complex of phthalocyanine, azo or thioamide type; a metal such as Co, Cr, Fe, Mn, Ni, Cu, or Ti; and an oxide, nitride or nitrogen oxide of the metal. In the invention, the content of the near-infrared absorbent in the image forming layer is preferably from 1 to 10% by weight. The content of the near-infrared absorbent in the hydrophilic layer is preferably from 3 to 20% by weight.

Exemplarily, the near-infrared absorbents include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds can be used singly or in combination of two or more kinds thereof.

A preparation method of a planographic printing plate of a planographic printing plate precursor will be explained below.

In the invention, images are preferably formed on the planographic printing plate precursor according to a so-called heat mode image forming method employing a thermal head or a laser.

As the laser, a laser emitting light having an emitting wavelength of 300 to 1500 nm is preferably used. Examples thereof include Ar ion laser, Kr ion laser, He—Ne laser, He—Cd laser, ruby laser, glass laser, titanium sapphire laser, dye laser, nitrogen laser, metal vapor laser, eximer laser, a semi-conductor laser, and a YAG laser.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are more suitable for high density recording because they make it easy to enhance a precision of an optical system. In the case of the so-called multi-channel exposure wherein a plurality of light-emitting elements are used simultaneously, the method of scanning on an outer surface of a cylinder is optimum. In the case wherein a YAG laser having high exposure output is used, the method of scanning on an inner surface of a cylinder is optimum, since the method of scanning on an outer surface of a cylinder is difficult to greatly increase speed of rotation of the cylinder.

The printing method of the invention employing the planographic printing plate precursor will be explained below.

In the invention, images are formed employing an image recording device capable of employing the preparation method described above of the planographic printing plate from the planographic printing plate precursor. However, the image formation can be carried out exposing the planographic printing plate precursor by means of a plate setter or a directly imaging printing machine equipped with an exposure source. Image recording can be carried out exposing the printing precursor by means of a plate setter or a directly imaging printing machine equipped with an exposure source. Subsequently, the above-exposed planographic printing plate precursor is mounted without being developed with a specific developer on the plate cylinder of a printing machine, and ink and/or dampening water are supplied to the mounted plate precursor while rotating the plate cylinder to prepare a printing plate, followed by printing. Ordinarily, after several rotations of the cylinder, printing is carried out.

EXAMPLES

The invention will be detailed according to the following examples, but is not limited thereto.

Example 1

<<Preparation of a planographic printing plate precursor roll>>a planographic printing plate precursor in the form of roll <<Subbing Layer Formation>>

A 188 μm thick PET support with a length of 1000 m was corona discharged, and a first subbing layer coating solution having the following composition was coated onto the resulting support through a wire bar at 20° C. and 55% RH, and dried while transported at 140° C. in a dying zone with a 15 m length at a transporting rate of 15 m/minute to form a first subbing layer with a dry thickness of 0.4 μm.

Thereafter, the first subbing layer was corona discharged, and a second subbing layer coating solution having the following composition was coated onto the resulting subbing layer through an air knife at 35° C. and 22% RH, and dried while transported at 140° C. in a dying zone with a 15 m length at a transporting rate of 15 m/minute to form a second subbing layer with a dry thickness of 0.1 μm on the first subbing layer.

(Composition of First Subbing Layer Coating Solution)

| | |
|---|---|
| Acryl latex particles (n-BA/tert-BA/St/HEMA (= 28/22/25/25) copolymer) | 36.9 g |
| surfactant (A) | 0.36 g |
| Hardener (a) | 0.98 g |

Distilled water was added to the above composition to make 1,000 ml to obtain a first subbing layer coating solution.

| | |
|---|---|
| n-BA: | n-butyl acrylate |
| tert-BA: | t-butyl acrylate |
| St: | styrene |
| HEMA: | hydroxyethyl methacrylate |

(Composition of Second Subbing Layer Coating Solution)

| | |
|---|---|
| Gelatin | 9.6 g |
| Surfactant (A) | 0.4 g |
| Hardener (b) | 0.1 g |

Distilled water was added to the above composition to make 1,000 ml to obtain a second subbing layer coating solution.

Surfactant (A)

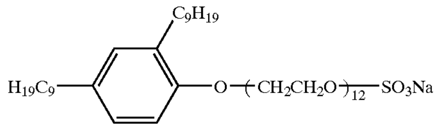

Hardener (a)

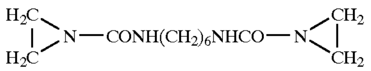

Hardener (b)

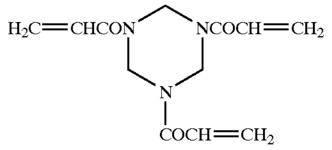

<<Formation of Hydrophilic Layer>>

The following hydrophilic layer coating solution was coated on the subbing layer through a wire bar #5, dried while transported at 100° C. in a dying zone with a 15 m length at a transporting rate of 15 m/minute to form a hydrophilic layer on the subbing layer. The resulting material was wound around a spool in the roll form, and further dried at 60° C. for 24 hours.

(Composition of Hydrophilic Layer Coating Solution)

An aqueous dispersion containing the following three components (a), (b), and (c) and having a solid content of 30% was prepared.

(a) Colloidal silica Snowtex S 17.34 parts by weight (solid content of 30% by weight, produced by Nissan Kagaku Co., Ltd.

(b) Necklace shaped colloidal 38.89 parts by weight silica Snowtex PS-M (solid content of 20% by weight, produced by Nissan Kagaku Co., Ltd.)

(c) Aluminosilicate particle 4.50 parts by weight AMT 08 (an average particle size of 0.6 μm, produced by Mizusawa Kagaku Co., Ltd.)

The following mixture was added to the above aqueous dispersion to prepare a hydrophilic layer coating solution.

Aqueous 4% by weight sodium 5.00 parts by weight carboxymethyl cellulose solution (produced by Kanto Kagaku Co., Ltd.)

Aqueous 40% by weight solution of 4.50 parts by weight Fe, Mn, Cu complex oxide (MF Black 4500 produced by Dainichi Seika Co., Ltd.)

Montmorillonite BENGEL-31 gel 8.00 parts by weight (produced by Hojun Yoko Co., Ltd.)

Aqueous 1% by weight solution 2.27 parts by weight of Si-containing surfactant FZ2161 (produced by Nippon Unicar Co., Ltd.)

Aqueous 10% by weight solution of 1.00 parts by weight $Na_3PO_4$ (produced by Kanto Kagaku Co., Ltd.) Pure water 18.69 parts by weight <<Formation of Image Forming Layer (Outermost Layer) and Heat Treatment>>

The following image forming layer coating solution was coated on the hydrophilic layer through a wire bar #5, dried while transported at 60° C. in a dying zone with a 15 m length at a transporting rate of 15 m/minute to form an image forming layer (outermost layer) on the hydrophilic layer.

The resulting material was wound around a spool in the roll form, and further heat-treated at 50° C. for 24 hours. Thus, a planographic printing plate precursor roll 1 was prepared.

(Composition of Image Forming Layer Coating Solution)

Aqueous carnauba wax particle 7.50 parts by weight dispersion (Hi-Disper A-118 (having a solid content of 40% by weight, produced by GifuCerac Co., Ltd.)

Trehalose powder 2.00 parts by weight (Treha, produced by Hayashihara Shoji Co., Ltd.)

Pure water 90.50 parts by weight

<<Preparation of planographic printing plate precursor sheet 1>>planographic printing plate precursor in the sheet form A planographic printing plate precursor sheet 1 was prepared in the same manner as the planographic printing plate precursor roll 1, except that the resulting planographic printing plate precursor was cut into sheets instead of being wound around a spool.

<<Preparation of a planographic printing plate precursor roll 2>>a planographic printing plate precursor in the form of roll A 188 μm thick PET support with a length of 1000 m was corona discharged, and a light-heat converting layer coating solution having the following composition was coated onto the resulting support, dried while transported at 100° C. in a dying zone with a 15 m length at a transporting rate of 15 m/minute to form a light-heat converting layer with a dry thickness of 2 μm, and wound around a spool in the roll form. Thus, a planographic printing plate precursor roll 2 was prepared.

(Composition of Light-heat Converting Layer)

| | |
|---|---|
| Carbon black dispersion described later | 55 g |
| Nitrocellulose (30% n-propanol solution) | 7.2 g |
| Tetrahydrofuran | 45 g |
| (Preparation of carbon black dispersion) | |
| Carbon black (#40 produced by Mitsubishi Chemical Corporation) | 5.0 g |
| Polyurethane (Nippolan 2304 produced by Nippon Urethane Co., Ltd.) | 5.0 g |
| Solsperse S 20000 (produced by ICI Co., Ltd.) | 0.27 g |
| Solsperse S 12000 (produced by ICI Co., Ltd.) | 0.22 g |
| Tetrahydrofuran | 45 g |
| Glass beads | 160 g |

A mixture of the above components was stirred in a paint shaker for 30 minutes, and then the glass beads were filtered to prepare a carbon black dispersion.

Subsequently, the following silicone rubber coating solution was coated on the resulting light-heat converting layer, and dried while transported at 120° C. in a dying zone with a 15 m length at a transporting rate of 15 m/minute to form a silicone rubber layer.

(Composition of Silicone Rubber Layer Coating Solution)

| | |
|---|---|
| α, ω-Divinylpolysiloxane (polymerization degree: 700) | 9.00 g |
| $(CH_3)_3$—Si—O—$SiH(CH_3)$—$O)_8$—$Si(CH_3)_3$ | 0.50 g |
| Polydimethylsiloxane (polymerization degree: 8000) | 0.50 g |
| Olefine-chloroplatinic acid | 0.04 g |
| Restrainer (HC≡C—$C(CH_3)_2$—O—$Si(CH_3)_2$] | 0.07 g |
| Heptane | 55 g |

<<Slip Property of Lubricant Component>>

In each of the planographic printing plate precursor rolls 1 and 2, and the planographic printing plate precursor sheet 1, the surface of the support opposite the image forming layer was observed through a transmission electron microscope (TEM, at 10,000 power). The results are shown in Table 1.

Planographic printing plate precursor roll 1: It was confirmed that carnauba wax particles as lubricant components existed on the surface of the support opposite the image forming layer.

Planographic printing plate precursor roll 2: It was not confirmed that carnauba wax particles as lubricant components existed on the surface of the support opposite the image forming layer.

Planographic printing plate precursor sheet 1: It was not confirmed that carnauba wax particles as lubricant components existed on the surface of the support opposite the image forming layer.

In each of the precursor rolls 1 and 2, and the precursor sheet 1, coefficient of static friction of the surface on the image forming layer side and the surface of the support opposite the image forming layer was measured. The coefficient of static friction was measured at 25° C. and 65% RH according to a measuring method of coefficient of friction defined in JIS K 7125.

TABLE 1

| Plano-graphic printing plate precursor | Coefficient of static friction (before winding): Outermost layer on the image forming layer side | Coefficient of static friction (before winding): Outermost layer on the side of the support opposite the image forming layer | Coefficient of static friction (after winding): Outermost layer on the image forming layer side | Coefficient of static friction (after winding): Outermost layer on the side of the support opposite the image forming layer | *Transfer of Lubricant component | Remarks |
|---|---|---|---|---|---|---|
| Roll 1 | 0.8 | 3.1 | 1.0 | 1.5 | Yes | Inv. |
| Sheet 1 | 1.0 | 2.4 | 1.1 | 2.5 | No | Comp. |
| Roll 2 | 1.7 | 3.5 | 1.8 | 3.5 | No | Comp. |

Inv.: Invention, Comp.: Comparative
*Transfer of the lubricant component (carnauba wax particles) to the surface on the side of the support opposite the image forming layer was observed through a transmission electron microscope (TEM).

<<Staining, Transport Scratches or Transport Jamming Occurring in a Printing Plate Preparing Process and in a Printing Process>>

The planographic printing plate precursor roll 1 was evaluated for staining, transport scratches or transport jamming occurring in the printing plate preparing process and in the printing process. Preparation of the printing plate and printing employing the printing plate were carried out employing the printing press as shown in FIG. 1.

Preparation of the printing plate and printing were carried out employing a printing press shown in FIG. 1.

In FIG. 1, the printing press comprises a first plate cylinder 11, which moves between a first printing position as shown in a solid line and an image forming position as shown in a two-dot chain line, and a second plate cylinder 12, which moves between a second printing position as shown in a solid line and the image forming position as shown in a two-dot chain line. Around the first plate cylinder, which has moved to the first printing position, are provided an ink supply device 20*a* for supplying, for example, black ink to the printing plate, an ink supply device 20*b* for supplying, for example, magenta ink to a printing plate, and a dampening water supply device 21 for supplying dampening water to a printing plate. Around the second plate cylinder, which has moved to the second printing position, are provided an ink supply device 20*c* for supplying, for example, cyan ink to a printing plate, an ink supply device 20*d* for supplying, for example, yellow ink to a printing plate, and a dampening water supply device 22 for supplying dampening water to a printing plate. Further, around the first or second plate cylinder, which has been transported to the image forming position, are provided a planographic printing plate precursor supply section 23 from which a long length planographic printing plate precursor P is unwound through a pair of guide rollers 53, a cutter 54 for cutting the precursor P into a sheet, a guide rail 55 and a guide roller 56 each transporting the sheet to the surface of the plate cylinder, a planographic printing plate discharge section 24 and an imaging device 25. Furthermore, the printing press comprises a first blanket cylinder 13 provided so as that it can contact the first plate cylinder 11, a second blanket cylinder 14 provided so as that it can contact the second plate cylinder 12, an impression cylinder 15 provided so that it can contact the first and second blanket cylinders 13 and 14 at different positions, a paper sheet feeding cylinder 16 for transporting to the impression cylinder 15 a paper sheet S fed from a paper sheet feeding section 27, and a pair of a paper sheet discharge cylinders 17 for receiving a printed paper sheet at a printed paper sheet receiving section 28.

The printing press of FIG. 1 is a printing press in which an image is formed on a planographic printing plate precursor mounted on the first plate cylinder 11 or the second plate cylinder 12 to obtain a printing plate, and ink supplied to the resulting printing plate was transferred to a printing paper sheet S through the first and second blanket cylinder 13 and 14, whereby printing is carried out.

Thus, employing the printing press shown in FIG. 1, the planographic printing plate precursor roll 1 was cut into a sheet of a 550 mm×650 mm size, transported to the surface of the plate cylinder provided at the image forming position, exposed at an exposure energy of 250 mJ/cm$^2$ through a semiconductor laser having a wavelength of 830 nm to form an image with 30% screen tint, and transported to the printing position without development.

To the resulting planographic printing plate precursor, a printing ink, Hyecho M (black) produced by Toyo Ink Manufacturing Co. was supplied from ink supply section and a dampening water, Astromark 3 produced by Nikken Kagaku Co., Ltd. from a dampening water supply section, and a printing paper sheet was fed and transported to the impression cylinder. Thus, printing was carried out.

Five thousand printing paper sheets were printed. The obtained printed matter provided good dot reproduction, and produced no stains at the portions corresponding to those on the planographic printing plate precursor which were scratched while transporting.

A process, in which the planographic printing plate precursor roll 1 was cut into a sheet and transported to the surface of the plate cylinder provided at the image forming position, employing the printing press shown in FIG. 1, was repeated ten times, but no jamming occurred.

(Evaluation of Planographic Printing Plate Precursor Sheet 1 in the Printing Plate Preparing Process and in the Printing Process)

A process, in which the planographic printing plate precursor sheet 1 was provided upstream the guide rollers 53, and transported to the surface of the plate cylinder-provided at the image forming position, employing the printing press shown in FIG. 1, was repeated five times, but jamming occurred two times.

Printing process was carried out in the same manner as in the planographic printing plate precursor roll 1, but the printed matter had in places staining along the transport direction due to transport scratches.

(Evaluation of Planographic Printing Plate Precursor Roll Sample 2 in the Printing Plate Preparing Process and in the Printing Process)

Printing was carried out employing the planographic printing plate precursor roll sample 2 in the same manner as in the planographic printing plate precursor roll sample 1 except that the roll sample 2 was exposed at an exposure energy of 600 mJ/cm$^2$, ink for waterless printing plate was supplied to the resulting printing plate precursor, without supplying a dampening water.

The printed matter had staining along the transport direction due to transport scratches, which could not be practically used. A process, in which the planographic printing plate precursor roll sample 2 was cut into a sheet, and transported to the surface of the plate cylinder provided at the image forming position, employing the printing press shown in FIG. 1, was repeated five times, but jamming occurred three times.

As is apparent from the above, it has been confirmed that a processless printing plate precursor can provide printed matter with high quality with good transportability, which is manufactured by a method comprising the steps of preparing a planographic printing plate precursor comprising a plastic support, a hydrophilic layer and a first outermost layer in that order provided thereon, and a second outermost layer of the support opposite the first outermost layer, so that either the first outermost layer or the second outermost layer contains a lubricant component, and winding the resulting planographic printing plate precursor around a spool to form a roll.

EFFECT OF THE INVENTION

The present invention can provide a planographic printing plate precursor with reduced transport scratches, and a printing method employing the planographic printing plate precursor providing reduced image defects.

What is claimed is:

1. A planographic printing plate precursor comprising a support, and provided thereon, an image forming layer, a first outermost layer on the image forming layer side and a second outermost layer on the side of the support opposite the first outermost layer, the first and second outermost layers containing a lubricant component, wherein the planographic printing plate precursor is manufactured either by a method comprising the steps of preparing a planographic printing plate precursor comprising a support and provided thereon, an image forming layer so that only a first outermost layer on the image forming layer side contains a lubricant component and winding the resulting printing plate precursor around a spool in the roll form to transfer a part of the lubricant component of the first outermost layer to the second outermost layer, or by a method comprising the steps of preparing a planographic printing plate precursor comprising a support and provided thereon, an image forming layer so that only a second outermost layer on the side of the support opposite the first outermost layer contains a lubricant component and winding the resulting printing plate precursor around a spool in the roll form to transfer a part of the lubricant component of the second outermost layer to the first outermost layer.

2. The planographic printing plate precursor of claim 1, wherein a hydrophilic layer is provided between the image forming layer and the support.

3. The planographic printing plate precursor of claim 1, wherein the first outermost layer is the image forming layer, and the lubricant component is heat-fusible particles with an oleophilic property.

4. The planographic printing plate precursor of claim 1, wherein the support comprises a plastic.

5. The planographic printing plate precursor of claim 1, wherein the lubricant component is in the form of particles, and the particle diameter of the particles is 0.1 to 2.0 $\mu$m.

6. The planographic printing plate precursor of claim 1, wherein the first outermost layer and the second outermost layer contain the lubricant component in an amount of from 0.05 to 2.00 $g/m^2$.

7. A planographic printing plate precursor comprising a support and provided thereon, an image forming layer, a first outermost layer on the image forming layer side and a second outermost layer provided on the side of the support opposite the first outermost layer, the first and second outermost layer containing a lubricant component and having a coefficient of static friction of from 0.05 to 2.00, wherein the planographic printing plate precursor is manufactured by a method comprising the steps of preparing a planographic printing plate precursor comprising a support and provided thereon, an image forming layer so that only a first outermost layer on the image forming layer side contains a lubricant component and has a coefficient of static friction of from 0.05to 2.00, and winding the resulting printing plate precursor around a spool in the roll form to transfer a part of the lubricant component of the first outermost layer to the second outermost layer, so that a second outermost layer provided on the side of the support opposite the first outermost layer has a coefficient of static friction of from 0.05 to 2.00.

8. The planographic printing plate precursor of claim 7, wherein the second outermost layer provided on the side of the support opposite the first outermost layer, before the winding step, has a coefficient of static friction of from 2.00 to 5.0.

9. A method of printing employing a planographic printing plate precursor, comprising a support and provided thereon, an image forming layer, a first outermost layer on the image forming layer side and a second outermost layer on the side of the support opposite the first outermost layer, the first and second outermost layers containing a lubricant component, wherein the planographic printing plate precursor is manufactured either by a method comprising the steps of preparing a planographic printing plate precursor comprising a support and provided thereon, an image forming layer so that only a first outermost layer on the image forming layer side contains a lubricant component and winding the resulting printing plate precursor around a spool in the roll form to transfer a part of the lubricant component of the first outermost layer to the second outermost layer, or by a method comprising the steps of preparing a planographic printing plate precursor comprising a support and provided thereon, an image forming layer so that only a second outermost layer on the side of the support opposite the first outermost layer contains a lubricant component and winding the resulting printing plate precursor around a spool in the roll form to transfer a part of the lubricant component of the second outermost layer to the first outermost layer, the method comprising the steps of imagewise exposing the planographic printing plate precursor to laser light to form an image on the planographic printing plate precursor, and supplying ink to the exposed planographic printing plate precursor.

10. The method of printing of claim 9, wherein the method further comprises a step of supplying dampening water to the planographic printing plate precursor between the imagewise exposing step and the ink supplying step.

* * * * *